United States Patent [19]
Hadermann et al.

[11] 3,944,918
[45] Mar. 16, 1976

[54] ELECTROOSMOTIC KILOVOLTMETER

[76] Inventors: Albert F. Hadermann, Rte. 1, Ijamsville, Md. 21754; Paul F. Waters, 3318 45th St. NW., Washington, D.C. 20016; Jung Woo Woo, 2008 N. Adams St., Arlington, Va. 22201

[22] Filed: July 29, 1974

[21] Appl. No.: 492,895

Related U.S. Application Data

[63] Continuation-in-part of Ser. No. 366,006, June 1, 1973, abandoned.

[52] U.S. Cl. .................................. 324/94
[51] Int. Cl.² .......................... G01R 27/22
[58] Field of Search .............. 324/94; 417/48

[56] References Cited
UNITED STATES PATENTS 3,209,255  9/1965  Estes et al. ........................ 324/94
3,346,810  10/1967  Littmann ........................... 324/174

OTHER PUBLICATIONS

Daguin, P.A., Traite De Physique, Pub. 1867, pp. 444–445.

R. Hard, R. N. Lane, "Principles of Very Low Power Electrochemical Control Devices," Journ. Electro Chemical Society, Vol. 104, No. 12, 1957.

Primary Examiner—Alfred E. Smith
Assistant Examiner—R. Hille
Attorney, Agent, or Firm—Joseph P. Nigon

[57]  ABSTRACT

A kilovoltmeter capable of indicating potentials in the kilovolt range is disclosed. The device is based on the phenomenon of electroosmosis engendered by a strong electric field.

3 Claims, 5 Drawing Figures

ELECTROOSMOTIC KILOVOLTMETER

BACKGROUND OF THE INVENTION

There are many applications requiring a rugged, reliable kilovoltmeter with a high electrical impedance and a current drain of the order of 10 microamperes at 25 kilovolts. The present invention can be incorporated in electronic test equipment or can be built into high-voltage power supplies. The present invention draws a negligible current relative to the normally milliampere output of transformer based DC high-voltage power supplies.

Nonaqueous electroosmotic systems are amenable to the study of electrokinetic phenomena in strong electric fields. This point has not been examined extensively in the past, although nonlinear pressure-voltage relationships have been observed in studies at higher voltages than can be conveniently applied to aqueous systems.

Coehn and Raydt studied electrokinetic phenomena in organic systems, but it has since been thought that their results are suspect because the liquids they employed were either shaken with acids before use or were highly impure by present-day standards. Gortner attempted to ascribe electrokinetic effects in nonaqueous systems to a nonionic mechanism. However, La Mer and Downes and Fuoss have shown that ions can exist even in pure hydrocarbon liquids. Stuetzer has observed an electrokinetic effect, termed ion-drag pumping, in pure, low polarity hydrocarbon liquids. Lorenz studied electroosmotic pressure in the quartz-acetone system, but halted the investigation at the level of electric field strengths where the relationship between the pressure and the voltage becomes strongly nonlinear. Lorenz ascribed the nonlinearity to polarization phenomena at the electrodes.

Lauffer and Gortner thought that electrokinetic effects observed in systems comprised of aliphatic alcohols and alumina were due to charges derived from the liquid or the solid, but did not stress the role played by water, particularly at high field strengths. Rastogi and Jha discussed the system consisting of acetone and Pyrex glass sinters in terms of an irreversible thermodynamic treatment using nonlinear coupling constants. Rastogi, Singh, and Singh have discussed the methanol-quartz system in similar terms. Higher order coupling constants were used to obtain expressions which fit the experimental data. References to these publications can be found in "High-Voltage Electroosmosis. Pressure-Voltage Behavior in the System gamma-Alumina-2-Propanol," A. F. Hadermann, P. F. Waters, and J. W. Woo, J. Phys. Chem., 78, 65 (1974). This publication is incorporated herein by reference.

SUMMARY OF THE INVENTION

This invention relates to a novel device which is based on the phenomenon of electroosmosis engendered by a strong electric field. The invention is used to indicate potentials in the kilovolt range. The advantages of the present invention over the prior art involving D'Arsenval meter movements in series with large resistors are:

1. A very high electrical input impedance, of $10^9$ and higher ohm-cm. This leads to dispensing with the need for current-limiting or potential-dropping resistors external to the active region of the kilovoltmeter. The kilovoltmeter is its own high-voltage, high-impedance compact resistor.

2. The complete absence of moving parts in the conventional mechanical sense, other than the lever/indicator mechanism in one embodiment of the present invention and no moving parts at all in the other embodiment.

3. Ease of manufacture in comparison to D'Arsenval type kilovoltmeters.

4. Ruggedness of the inherent design relative to electro-mechanical kilovoltmeters of comparable impedance and sensitivity making the invention ideal for incorporation in electronic test equipment which must be portable, e.g., television power supply testers, high-voltage circuit testers, etc.

The basis of the electroosmotic phenomenon in gamma-alumina/isopropanol systems is the selective adsorption of ionic species and the establishment of an electrokinetic potential. Water in the porous region of the electroosmotic couple serves as the major source of ions and this model is used in the derivations of a new electroosmotic pressure equation.

Several electric field effects have been observed in electrolyte solutions. They are of different relative importance in the gamma-alumina-isopropanol-water system. Stokes' law holds up to ionic velocities of the order of $10^5$ cm/sec and if we assume a field strength of 75 kV/cm and an ionic mobility of $3.62 \times 10^{-3}$ (cm/sec) (V/cm) for H+, we obtain a velocity of only 271 cm/sec. Thus, nonlinearity cannot arise from this source. Likewise, nonlinearity should not stem from the Wien effect because the limit of the equivalent conductance at infinite dilution is also the limit when the Wien effect is operating. In the water-2-propanol system the free ionic content is very low and each ion may already be considered to be free of the others before the field is applied. The most important field effect in the water isopropanol system is the dissociation field effect although it is not possible to rule out completely the development of a simple space charging by a mechanism similar to that proposed by Stuetzer. In the case of weak electrolytes the dissociation field effect may be the most important factor leading to an increase in the concentration of ions with increasing field strength.

When water is present within the pore volume of the gamma-alumina sample it serves as a source of hydroxyl ions and solvated protons. The region below the plane of shear is capable of selectivity adsorbing hydroxyl ions. Thus, the surface charge density will be a function of the applied potential. To simplify the treatment, it will be assumed that the intrinsic charge below the plane of shear can be safely neglected when water is present and will become manifest only in dry systems.

The electroosmotic pressure, P for a system containing traces of water in isopropanol is given by:

$$P = 1.055 \times 10^{13} wV + 2.88 \times 10^8 w V^2/Dl$$

where $V$ is the voltage $D$ is the dielectric constant of the fluid in the pores, $l$ is the distance between electrodes and $\omega$ is defined as $$W = f \sqrt{\alpha_o C_o / \bar{\gamma}^2}$$

where $f$ is the electrostatic adsorption moment, $\alpha_o$ is the unperturbed dissociation constant of the weak electrolyte $C_o$ is the concentration of weak electrolyte and $\bar{\gamma}$ is the meanpore radius.

In the absence of weak electrolyte $C_o = O$ and the system obeys Perrin's equation. Such systems obey Ohm's law up to 50 kilovolts and can be employed as efficient and simple kilovoltmeters which combine the current-limiting and indicating functions in one integrated package.

Kilovoltmeters of greater sensitivity may be constructed from nonlinear electroosmotic pressure/voltage systems. These must be provided with a means of mantaining a constant quantity of weak electrolyte in the electroosmotically active region.

DESCRIPTION OF THE PREFERRED EMBODIMENTS

The concept of the electroosmotic kilovoltmeter includes the use of non-polar as well as polar liquids. Thus it is possible to employ liquids with specific resistivities greater than or less than $10^{13}$ ohm-cm. Examples of suitable liquids include isopropanol, butyric acid, propylamine, dioxane, ethanol, 1-hexanol, acetone, 2-pentanone, dimethylformamide, etc., or any other physically and chemically compatible substance which is a liquid under the conditions of temperature and pressure experienced by this invention.

The porous solid can be comprised of alumina, silica, powdered glass and quartz, titanium oxide, barium sulfate, organic polymers, etc.

Figure 1:
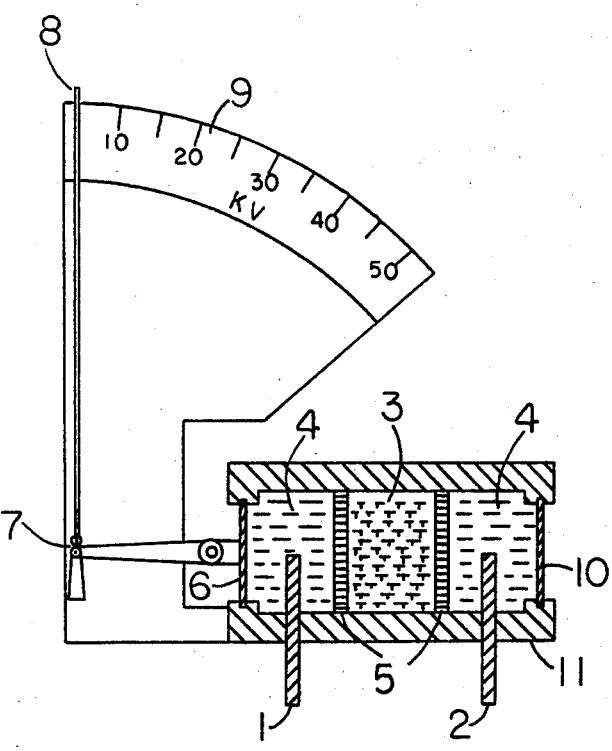
FIG. 1 shows the basic mechanism of the present invention.

Referring in detail to the accompanying drawings:

FIG. 1 illustrates the basic mechanism and design of the present invention. When a potential difference in the kilovolt range is applied across electrodes, 1, and, 2, an electroosmotic pressure proportional to the applied potential is generated within the porous region, 3, which is typically constituted of gamma alumina and is saturated with isopropanol which may or may not contain an added weak electrolyte such as water. Electrode chambers, 4, are filled with the liquid which permeates the porous solid region, e.g., isopropanol. Porous supports, 5, are not electroosmotically active, i.e., porous glass or teflon of a large pore size relative to the mean pore size within the porous plug, 3. When electrode, 1, is grounded and electrode, 2, is connected to a kilovolt source whose potential is to be measured an electroosmotic pressure will be exerted on the thin flexible member, 6, causing it to bow outward and exert a force on the meter movement linkage, 7. The deflection of the pointer or indicator, 8 is read out directly on the scale, 9, as an applied potential in kilovolts. The thin flexible member, 10, will bow inward as member, 6, bows outward in response to the electroosmotic pressure engendered by the applied potential. The entire electroosmotic system is housed in the cylindrical insulating housing, 11.

Kilovoltmeters have not yet been grounded on the phenomenon of electroosmosis in strong electric fields because the phenomenon has not been adequately or thoroughly studied before. In accordance with this invention FIG. 2 has been provided to illustrate the calibration characteristics of an electroosmotic kilovoltmeter prepared by using powdered gamma alumina and isopropanol. FIG. 3 illustrates the high electrical impedance of the alumina/isopropanol electroosmotic couple shown in FIG. 2.

Figure 2:
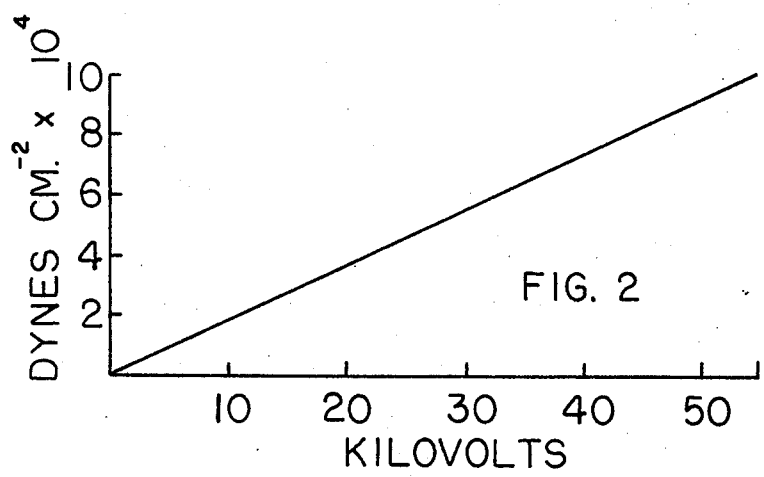
FIG. 2 illustrates the calibration characteristics of an electroosmotic kilovoltmeter wherein the liquid is isopropanol and the solid is powdered gamma alumina.
Figure 3:
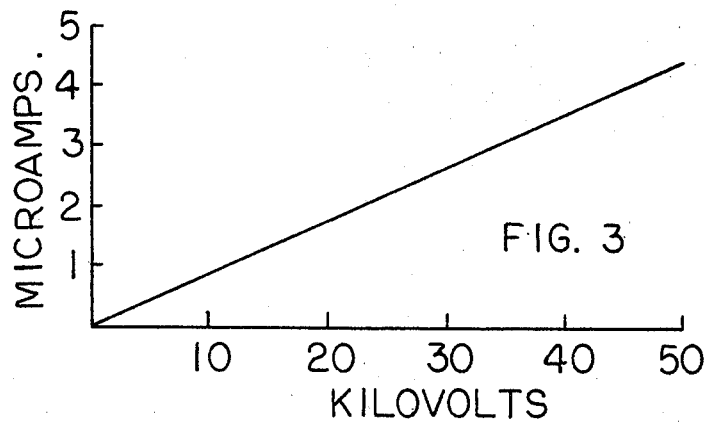
FIG. 3 illustrates the high electrical impedance of the alumina/isopropanol electroosmotic couple of FIG. 2.

The electroosmotic couple corresponding to FIGS. 2 and 3 consists of gamma alumina which contains 5.1% water plus aluminol hydroxyl groups and has a mean particle size of 2.0 microns. The isopropanol contains less than ten parts per million of water and the couple was equilibrated by treatment at 31 kilovolts for nine hours.

Figure 4:
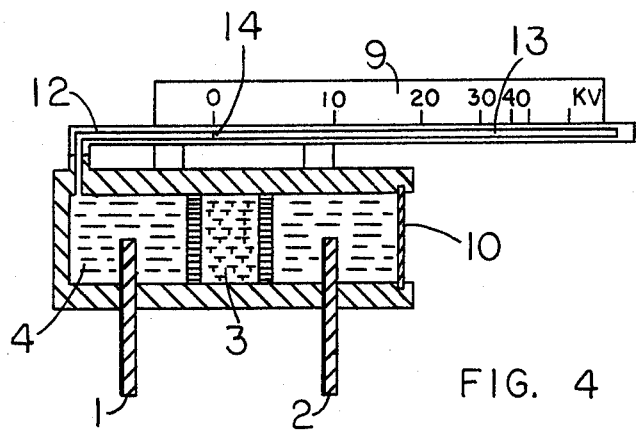
FIG. 4 shows a second embodiment of the present invention.

FIG. 4 illustrates another embodiment of the present invention. In this design the voltage applied to the electrodes, 1, and, 2, induces an electroosmotic pressure in region 3 which is transferred to the fluid within the electrode compartment, 4, which causes the liquid within the electrode compartment to move into capillary tube, 12, and compress the gas in region, 13, of the tube. The position of the interface, 14, is read against the scale, 9, which is calibrated to read directly in kilovolts applied to the electrodes. The gas in region, 13, is chosen to have a very low solubility in the liquid in the electroosmotic couple. The flexible member 10, is provided in order to permit migration of the liquid into the capillary tube, 12.

Figure 5:
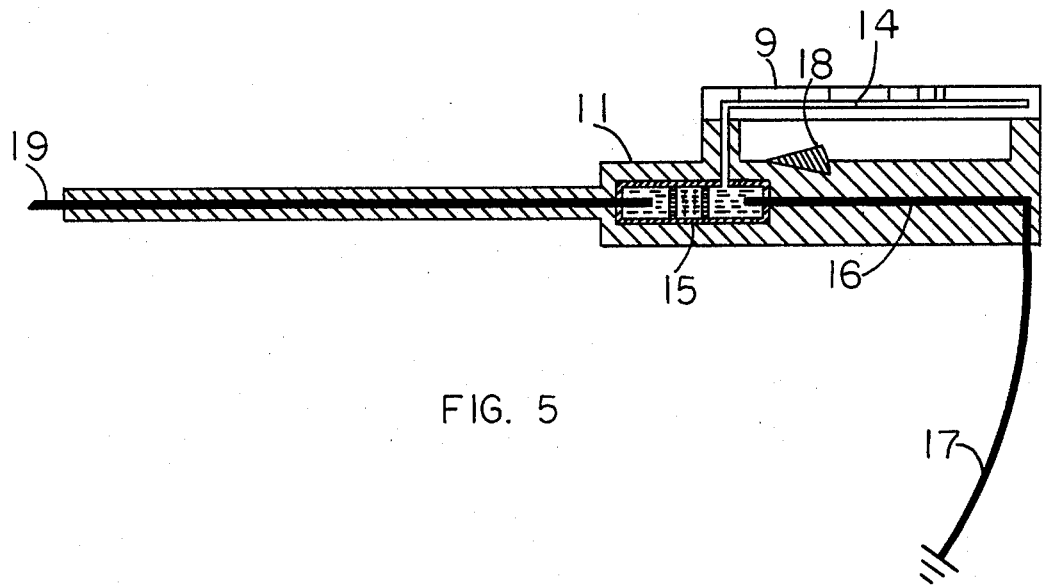
FIG. 5 illustrates a third embodiment of the invention as a hand held tester for high voltage components.

FIG. 5 illustrates the use of the invention as described in FIG. 4 in a convenient hand-held tester to be used in servicing television and electronic high-voltage components. The electroosmotic pressure generator, 15, resides within the molded, insulated handle and body of the tester, 11. The grounded end of the electroosmotic pressure generator passes through the body of the handle, 16, and emerges as the ground wire, 17. Lead, 17, may be provided with a clip for connection to ground. The liquid/gas interface, 14, within the capillary, 12, may be read against the scale, 9, which is graduated directly in kilovolts. The switch, 18, is provided for changing the sign of the ground wire connection for positive ground circuitry. The tip, 19 is held against the source to be tested.

What is claimed is:

1. An electroosmotic kilovoltmeter which comprises in combination a means of generating electroosmotic pressure comprising a polar, powdered or sintered dielectric in contact with a polar or non-polar, non-aqueous dielectric liquid, free from all traces of water, which is its own intrinsic high impedance, means for indicating the electroosmotic pressure generated and means for relating said pressure as applied kilovolt potential.

2. The kilovoltmeter according to claim 1 wherein the dielectric liquid is selected from the group consisting of isopropanol, dioxane, ethanol, 1-hexanol, acetone, 2-pentanone dimethylformamide, dimethylsulfoxide, propylamine and butyric acid.

3. The kilovoltmeter according to claim 1 wherein the powdered solid dielectric is selected from the group consisting of alumina, silica, powdered glass, quartz, titanium oxide, barium sulfate and organic polymers.

* * * * *